(12) United States Patent
Walker et al.

(10) Patent No.: US 7,825,450 B2
(45) Date of Patent: *Nov. 2, 2010

(54) SACRIFICIAL SELF-ALIGNED INTERCONNECT STRUCTURES

(75) Inventors: Michael A. Walker, Boise, ID (US); Karl M. Robinson, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 58 days.

This patent is subject to a terminal disclaimer.

(21) Appl. No.: 12/205,019

(22) Filed: Sep. 5, 2008

(65) Prior Publication Data

US 2008/0315330 A1    Dec. 25, 2008

Related U.S. Application Data

(63) Continuation of application No. 11/329,739, filed on Jan. 11, 2006, now Pat. No. 7,427,793, which is a continuation of application No. 10/721,147, filed on Nov. 25, 2003, now Pat. No. 6,995,072, which is a continuation of application No. 09/012,388, filed on Jan. 23, 1998, now abandoned.

(51) Int. Cl.
   *H01L 27/108*   (2006.01)
   *H01L 29/94*   (2006.01)
(52) U.S. Cl. ............... 257/303; 257/304; 257/E27.086
(58) Field of Classification Search ................ 257/301, 257/303, 304, E27.086
   See application file for complete search history.

(56) References Cited

U.S. PATENT DOCUMENTS

| | | |
|---|---|---|
| 4,786,954 A | 11/1988 | Morie et al. |
| 4,855,952 A | 8/1989 | Kiyosumi |
| 5,077,688 A | 12/1991 | Kumanoya et al. |
| 5,120,677 A | 6/1992 | Wakamatsu |
| 5,166,084 A | 11/1992 | Pfiester |
| 5,286,344 A | 2/1994 | Blalock et al. |
| 5,343,354 A | 8/1994 | Lee et al. |
| 5,389,559 A | 2/1995 | Hsieh et al. |
| 5,395,786 A | 3/1995 | Hsu et al. |

(Continued)

OTHER PUBLICATIONS

Nesbit et al., A 0.6 μm2 256Mb Trench DRAM Cell With Self-Aligned BuriEd STrap (BEST), IEDM 93-627 through 630, pp. 26.2.1 through 26.2.4, 0-7803-1450-6, © 1993 IEEE.

*Primary Examiner*—Phat X Cao
(74) *Attorney, Agent, or Firm*—TraskBritt

(57) ABSTRACT

A sacrificial, self-aligned polysilicon interconnect structure is formed in a region of insulating material adjacent to an active region location and underlying a semiconductor device of a substrate assembly in order to electrically connect the active region and the semiconductor device. A preexisting geometry of the active region is maintained during etching of an interconnect structure hole in which the interconnect structure is formed and saves process steps. Under the method, a region of insulating material is formed immediately adjacent the active region location. A nitride layer is formed over the active region and protects the active region while an interconnect structure hole is etched partially into the region of insulating material adjacent the active region location with an etching process that is selective to the nitride layer. The interconnect structure hole is filled with polysilicon, the surface of the substrate assembly is planarized, and the nitride layer is removed.

13 Claims, 3 Drawing Sheets

U.S. PATENT DOCUMENTS

| | | |
|---|---|---|
| 5,429,978 A | 7/1995 | Lu et al. |
| 5,594,682 A | 1/1997 | Lu et al. |
| 5,763,931 A | 6/1998 | Sugiyama |
| 5,795,804 A | 8/1998 | Jenq |
| 5,811,283 A | 9/1998 | Sun |
| 5,827,765 A | 10/1998 | Stengl et al. |
| 5,981,330 A | 11/1999 | Jenq |
| 6,168,986 B1 | 1/2001 | Walker et al. |
| 6,995,072 B2 | 2/2006 | Walker et al. |
| 7,427,793 B2 * | 9/2008 | Walker et al. ............... 257/303 |
| 2006/0113576 A1 | 6/2006 | Walker et al. |

* cited by examiner

SACRIFICIAL SELF-ALIGNED INTERCONNECT STRUCTURES

CROSS-REFERENCE TO RELATED APPLICATIONS

This application is a continuation of U.S. patent application Ser. No. 11/329,739 filed on Jan. 11, 2006, now U.S. Pat. No. 7,427,793, issued Sep. 23, 2008, which is a continuation of U.S. patent application Ser. No. 10/721,147, filed on Nov. 25, 2003, now U.S. Pat. No. 6,995,072, issued Feb. 7, 2006, which is a continuation of U.S. patent application Ser. No. 09/012,388, filed on Jan. 23, 1998, now abandoned. The disclosure of each of the previously referenced U.S. patent applications and patents is hereby incorporated by reference in its entirety.

TECHNICAL FIELD

The present invention relates to an interconnect structure during integrated circuit fabrication. More particularly, the present invention relates to a self-aligned interconnect structure for an integrated circuit. The self-aligned polysilicon interconnect structure is formed that can be sacrificially etched without damaging an adjacent active region that is provided with electrical communication through the interconnect structure.

BACKGROUND

In the microelectronics industry, a substrate refers to one or more semiconductor layers or structures that include active or operable portions of semiconductor devices. In the context of this document, the term "semiconductor substrate" is defined to mean any construction comprising semiconductive material including, but not limited to, bulk semiconductive material such as a semiconductive wafer, either alone or in assemblies comprising other materials thereon, and semiconductive material layers, either alone or in assemblies comprising other materials. The term "substrate" refers to any supporting structure including, but not limited to, the semiconductive substrates described above.

Modern integrated circuits are manufactured by an elaborate process in which a large number of electronic semiconductor devices are integrally formed on a small semiconductor substrate. The conventional semiconductor devices that are formed on the semiconductor substrate include capacitors, resistors, transistors, diodes, and the like. In advanced manufacturing of integrated circuits, hundreds of thousands of these semiconductor devices are formed on a single semiconductor substrate.

In order to compactly form the semiconductor devices, the semiconductor devices are formed on varying levels of the semiconductor substrate. Consequently, one step in the process of manufacturing an integrated circuit is to electrically connect the discrete semiconductor devices that are located on nonadjacent structural levels of the integrated circuit. One manner of electrically connecting these semiconductor devices is with an interconnect structure. The interconnect structure generally comprises a region of conducting material that is formed between the semiconductor devices or portions of the semiconductor devices that are being placed in electrical communication. The interconnect structure serves as a conduit for delivering electrical current between the semiconductor devices. Specific types of interconnect structures include local interconnects, contacts, buried contacts, vias, plugs, and filled trenches. Resistors and diodes also function as interconnect structures when making electrical contact between separate semiconductor devices.

The semiconductor industry is constantly under market demand to increase the speed at which integrated circuits operate, to increase the density of devices on the integrated circuits, and to reduce the price of the integrated circuits. To accomplish this task, the semiconductor devices used to form the integrated circuits are continually being increased in number and decreased in dimension in a process known as miniaturization. Interconnect structures and existing processes of forming interconnect structures must in turn be adapted to facilitate the constant miniaturization of the semiconductor devices for which the interconnect structures are used to connect.

One component of the integrated circuit that is becoming highly miniaturized is the active region. The active region is a doped area on a silicon substrate of the semiconductor substrate that is used together with other active regions to form a diode or transistor. The miniaturization of the active region complicates the formation of the interconnect structure in that, in order to maintain sufficient conductivity, the interconnect structure must be formed in exact alignment with the active region. Also, the area of the interconnect structure interfacing with the active region must be maximized. Thus, less area exists as tolerance for misalignment of the interconnect structure.

The active region is also becoming increasingly shallow. Consequently, measures must be taken in forming the interconnect structure and overlying semiconductor device to prevent silicon from the active region from being consumed. This shallowness of the active region often necessitates a planar interconnect structure interface that minimizes penetration of the original active region surface. The shallowness of the active region also often necessitates the use of a material other than the traditionally used aluminum in the interconnect structure for interfacing with the active region. Direct contact with aluminum causes the aluminum to diffuse into the silicon of the active region and to form spikes that can penetrate entirely through the active region, causing adverse electrical consequences.

These demands on the interconnect structure have not been adequately met by the existing conventional technology for forming the interconnect structure. As a result, formation of the interconnect structure is currently a limiting factor in the miniaturization of integrated circuits.

One type of interconnect structure frequently used in the conventional technology is the buried contact. The buried contact is a region of polysilicon that makes direct contact between the interconnect structure and the active region, eliminating the need for a metal link. In forming the buried contact, a window is opened in a thin gate oxide over the active region that the interconnect structure is to electrically connect. Thereafter, polysilicon is deposited in direct contact with the active region in the opening but is isolated from the underlying silicon substrate of the semiconductor substrate by gate oxide and by field oxides everywhere else. An ohmic contact is formed at the polysilicon and active region interface by diffusion into the active region of a dopant present in the polysilicon. This dopant diffusion into the active region in effect merges the polysilicon with the active region. A layer of insulating film is then deposited to cover the buried contact.

The buried contact is so termed because a metal layer can cross over the active region forming the buried contact without making an electrical connection to the buried contact. The use of a buried contact eliminates spiking and provides an additional benefit in that it makes available an additional level for forming interconnect structures on the integrated circuit.

This additional level allows circuit connections to be formed in one step and then in a later step to be connected with surface level metal interconnect lines. The additional level also adds significant interconnect structure routing flexibility to the integrated circuit design.

The buried contact also exhibits certain shortcomings. For instance, it is difficult at greater miniaturization levels to exactly align the contact hole with the active region when patterning and etching the contact hole. As a result, topographies near the active region can be penetrated and damaged during etching of the contact hole. For example, a misaligned buried contact hole etch can notch and, therefore, damage a gate stack. The damage reduces the performance of the active region and neighboring structures, which causes a loss of function of the semiconductor device being formed and possibly a defect condition in the entire integrated circuit. To remedy the problems associated with the buried contact, the prior art uses compensation techniques such as an etch stop barrier. These compensation techniques are time consuming and thus reduce throughput.

The active region is also, in order to compensate for the aforementioned complications, typically constructed with larger dimensions. As a result, the degree to which the active region can be miniaturized under the conventional technology is limited.

One improvement in conventional interconnect structures is the silicided contact. Formation of the silicided contact involves a metal such as titanium that, when deposited over the active region, combines with the silicon of the active region to form a low resistivity silicide. In forming the conventional silicided contact, the active region is formed and a layer of titanium is then deposited over the exposed active region. The semiconductor substrate is then heated with an annealing process. The annealing process causes a silicidation reaction to occur, creating titanium silicide everywhere that titanium is in contact with the silicon. Where the titanium is not in contact with silicon, the titanium remains unreacted. The unreacted titanium can then be selectively removed through the use of an etchant that does not attack the silicide. As a result, each exposed active region is substantially covered by a silicide film that is self-aligned to the top surface of the active region. The silicide film forms a conductive interface with the active region. A dielectric layer is then deposited over the active region and a contact hole is opened in the dielectric layer down to the silicide film. Thereafter, aluminum is deposited into the contact hole to make contact with the silicide film. The silicide film intervening between the aluminum and the active region allows the use of aluminum for filling the contact holes without the occurrence of spiking.

Further advantages of this method include a low contact resistance and a large area of contact between the active region and the silicide. Nevertheless, the self-aligned silicide contact also has drawbacks in that it requires numerous steps to form, reducing integrated circuit fabrication throughput. It also consumes a significant portion of the active region in being formed and cannot be sacrificially etched without harming the active region.

Another need in the art involves the fabrication of a memory circuit such as the DRAM, where capacitors must be placed in electrical contact with the active region. The formation of a DRAM capacitor typically requires a sacrificial region of polysilicon known as a landing pad above the active region to protect the active region against damage. The landing pad protects the underlying active region by acting as a buffer over the active region that can be sacrificially etched.

The conventional self-aligned silicide contact cannot be used as a landing pad. A further shortcoming of using the landing pad is that it is not always possible to conduct the sacrificial etching evenly across the whole semiconductor substrate. The center of the semiconductor substrate, in many instances, is etched at a faster rate than the edges. Thus, landing pads located at the center of the semiconductor substrate may be etched through, allowing the etching process to come in contact with the active region before landing pads at the edges of the semiconductor substrate are sufficiently etched. As a consequence, damage to active regions at the center of the semiconductor substrate can occur. Accordingly, an interconnect structure that can function as a sacrificial landing pad, that can be self-aligned, and that effectively protects the active region against over-etching is also needed in the art.

In a further problem in the art, conventional capacitors exhibit the problem of leakage paths from the base of the capacitor where the landing pad is formed into the underlying silicon substrate. The leakage reduces the amount of time the capacitor is able to hold a charge. Accordingly, a method for overcoming leakage through the base of the capacitor is also needed.

A further structure that is formed on the semiconductor substrate during the integrated circuit fabrication process is a region of insulating material known as the isolation region. The isolation region is used to electrically isolate P-channel regions from N-channel regions on CMOS integrated circuits, to prevent a destructive interaction between N-doped and P-doped regions of CMOS devices known as latch-up, and to separate closely spaced electrical devices such as capacitors. A need also exists in the art for a method for fabricating isolation regions with fewer steps in order to increase integrated circuit fabrication throughput and lower integrated circuit fabrication costs.

Accordingly, from the above discussion, it is apparent that what is needed in the art is a method whereby interconnect structures can be formed in a manner that maintains better control over device geometries in order to allow greater integrated circuit miniaturization. The formation of an interconnect structure that can be sacrificially etched without damaging an adjacent active region is also desirable. An interconnect structure is also needed that is self-aligned, that can serve as a sacrificial landing pad, that can prevent over-etch, and that can reduce capacitor leakage paths. It would be further desirable to be able to combine interconnect structure fabrication and isolation region fabrication to save process steps.

BRIEF SUMMARY

In accordance with the invention as embodied and broadly described herein in the preferred embodiment, a sacrificial, self-aligned polysilicon interconnect structure, as well as a method for constructing the sacrificial, self-aligned polysilicon interconnect structure, are provided. The method involves the utilization of mechanical polishing and stop-on-feature trench isolation in order to form the sacrificial, self-aligned polysilicon interconnect.

Under one embodiment of the method of the present invention, the sacrificial, self-aligned polysilicon interconnect structure comprises a buried contact that electrically connects an active region and an overlying semiconductor device. In an initial step of the method of the present invention, a vertically extending segment of a substrate assembly that is in need of being provided with electrical communication is first provided on the substrate assembly. The vertically extending segment in one embodiment will be doped to form an active region. The substrate assembly in one embodiment comprises a silicon substrate of a semiconductor wafer.

Above the vertically extending segment is formed a sacrificial covering layer which, in one embodiment, comprises a nitride layer. Other protective layers may also be formed together with the nitride layer. One such protective layer is a sacrificial oxide layer that is formed prior to the nitride layer and assists in protecting the underlying silicon substrate during a subsequent step in which the nitride layer is removed.

Once the nitride layer is formed, a region of insulating material, which, in one embodiment forms an isolation region, is created by etching a trench through the nitride layer and the sacrificial oxide layer and then filling the trench with a conformal dielectric film. In one embodiment, the conformal dielectric film comprises an oxide film.

After the isolation region is created, a contact hole is then etched into the isolation region at a location that is immediately adjacent an edge of the vertically extending segment. The contact hole is etched with an anisotropic stop-on-feature etching process that selectively etches the isolation region at a faster rate than it etches the sacrificial covering layer. Thus, even though the stop-on-feature etching process may be slightly misaligned from the edge of the vertically extending segment, the sacrificial covering layer protects the vertically extending segment from being etched, which causes the contact hole to self-align itself to the edge of the vertically extending segment.

The contact hole is etched partially into the isolation region but not through the isolation region. Consequently, a portion of the isolation region underlies the contact hole, isolating the contact hole against leakage and providing an etch stop for sacrificial etching processes. An edge of the vertically extending segment is exposed by the etching of the contact hole.

Once the contact hole is formed, at least a portion of the contact hole is filled with an electrically conductive material. In one embodiment, the electrically conductive material comprises a polysilicon layer.

The polysilicon layer abuts the edge of the vertically extending segment that was exposed during the step of etching the contact hole and electrically communicates with the vertically extending segment therethrough. Thus, the polysilicon layer is located to the side of and immediately adjacent the edge of the vertically extending segment and forms a planar vertical interface with the vertically extending segment.

In a further step, the isolation region and the polysilicon layer are polished back to the level of the nitride layer. The step of polishing back is preferably conducted with a form of mechanical or chemical-mechanical polishing (CMP) that is selective to nitride, though other forms of abrasive polishing could also be used.

After the step of polishing back is conducted, protective oxide caps are optionally grown over the buried contact. The protective oxide caps together with the oxide layer protect the buried contact from contamination or damage during removal of the nitride layer. If a process is used to remove the nitride layer that does not cause undesirable damage to the buried contact, the step of growing the protective caps and the step of forming the sacrificial oxide layer are not necessary.

The nitride layer is then removed. In one embodiment, a hot phosphoric acid nitride strip process is conducted to remove the nitride layer. Thereafter, the oxide caps and the sacrificial oxide layer underlying the nitride layer are removed.

Consequently, a buried contact is formed that comprises a vertically extending plug of electrically conductive material in the contact hole. The vertically extending plug electrically contacts at one side thereof an edge of the vertically extending segment. As the buried contact is formed to the side of the vertically extending segment rather than at the top of the vertically extending segment, the buried contact can be sacrificially etched in forming an overlying semiconductor device without risk of altering the geometry of the vertically extending segment. The sacrificial etching can also be conducted prior to removal of the nitride layer, further protecting the vertically extending segment.

Thus, when the vertically extending segment is doped to form an active region, formation of the buried contact does not alter a preexisting geometry of the active region, and consequently does not damage or deplete the active region. As a result, the active region can be designed with smaller dimensions, facilitating further miniaturization of the integrated circuit.

The vertically extending segment is preferably doped after the buried contact is formed. A semiconductor device is then typically constructed over the exposed active region contacting a top surface of the active region. In one embodiment, the semiconductor device is a DRAM container capacitor cell that is constructed over the buried contact. In constructing the container capacitor cell, a gate oxide region is first formed at the surface of the active region. Typically, several gate regions are then formed over the active region. The gate regions provide control signals to the container capacitor cell during integrated circuit operation and serve as guides for aligning the container capacitor cell during the formation thereof. Next, the container capacitor cell is patterned and formed over the buried contact. The buried contact serves as a sacrificial landing pad for the container capacitor cell formation process and, due to its unique structure, protects the active region against over-etching. The buried contact serves as a base for the container capacitor cell and, because it is encased in the non-conductive isolation region, also prevents charge leakage from the container capacitor cell.

Thus, a polysilicon interconnect structure that is sacrificial and self-aligned has been disclosed as well as a method for forming the interconnect structure utilizing mechanical polishing and stop-on-feature trench isolation to overcome problems existing in the art. The method combines isolation region formation and interconnect structure formation to reduce the required amount of integrated circuit fabrication process steps. The interconnect structure is formed in a self-aligned manner with better control over semiconductor device geometries. The interconnect structure can be sacrificially etched without damaging the adjacent active region and can serve as a landing pad for a capacitor, providing over-etch protection. Also, through the use of the interconnecting structure, charge leakage from the base of the capacitor can be reduced.

These and other features of the present invention will become more fully apparent from the following description and appended claims, or may be learned by the practice of the invention as set forth hereinafter.

BRIEF DESCRIPTION OF THE DRAWINGS

A more particular description of the invention briefly described above will be rendered by reference to specific embodiments thereof, which are illustrated in the appended drawings. Understanding that these drawings depict only typical embodiments of the invention and are not, therefore, to be considered limiting of its scope, the invention will be described and explained with additional specificity and detail through the use of the accompanying drawings in which.

DETAILED DESCRIPTION

Figure 1:
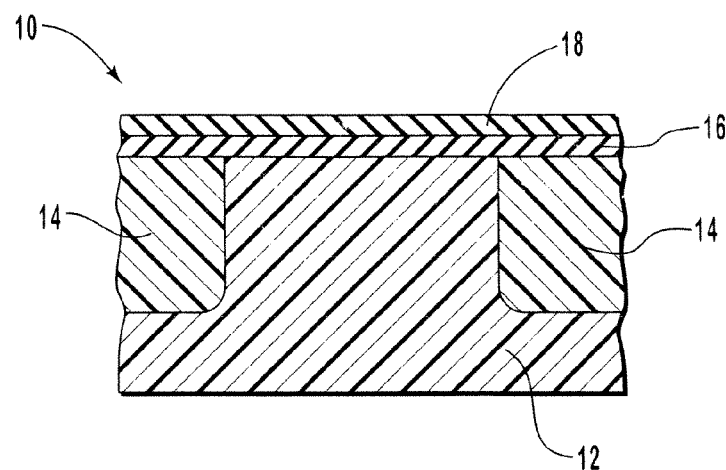
FIG. 1 is a cross-sectional view of a portion of an in-process integrated circuit semiconductor structure showing an initial step in the method of the present invention, wherein a silicon substrate is provided along with a pair of active regions and wherein a silicon nitride layer and an underling oxide layer are formed over the pair of active regions as a sacrificial covering layer.

FIG. 1 illustrates an initial step of the method of the present invention. In the initial step, a substrate assembly is provided on which sacrificial self-aligned interconnects will be formed. As defined herein, a substrate assembly comprises a substrate on which may be formed one or more structural layers. In the depicted embodiment, the substrate assembly comprises a substrate assembly 10 and a silicon substrate 12 is provided on substrate assembly 10. Shown by way of example in silicon substrate 12 is a vertically extending segment 14 of silicon substrate 12 where a pair of active regions is intended to be later formed. In the course of fabrication of an integrated circuit, the active regions are required to be placed in electrical communication with an overlying semiconductor device and the sacrificial self-aligned interconnects will be used for doing so.

In the depicted embodiment, the method of the present invention is used to form a particular type of interconnect structure known as the buried contact. Two buried contacts are shown being formed, each connecting one of two vertically extending segments 14 with a separate overlying semiconductor device in the form of a container capacitor cell. While the formation of two buried contacts electrically connecting two vertically extending segments 14 with two overlying container capacitor cells is illustrated, nevertheless, only one interconnect structure needs to be formed at a time and, of course, more than two could also be formed. Furthermore, varying types of interconnect structures other than a buried contact could also be formed with the method of the present invention and the semiconductor substrate assembly 10 could be other than the depicted container capacitor cells.

Vertically extending segments 14 can be initially formed to project above silicon substrate 12, but then can be planarized to assume a co-planar position with silicon substrate 12 by way of a polished back process. Polishing back can be conducted by an etchback process or by any form of mechanical polishing, though in the depicted embodiment, polishing back is preferably conducted with chemical mechanical polishing (CMP).

In a further step of the method of the present invention, a sacrificial covering layer is formed over vertically extending segments 14. In the depicted embodiment, the sacrificial covering layer comprises a nitride layer 18, which is composed of silicon nitride. In addition to nitride layer 18, other additional protective layers may also be deposited. For instance, in the depicted embodiment, a sacrificial oxide layer 16 is formed prior to the deposition of nitride layer 18. Sacrificial oxide layer 16 is used to protect underlying vertically extending segments 14 and silicon substrate 12 from damage during a subsequent step of removing nitride layer 18. Of course, if a process for removing nitride layer 18 is selected that does not require an additional protective layer, the formation of sacrificial oxide layer 16 can be eliminated. Any suitable process can be used for forming sacrificial oxide layer 16 and nitride layer 18.

Figure 2:
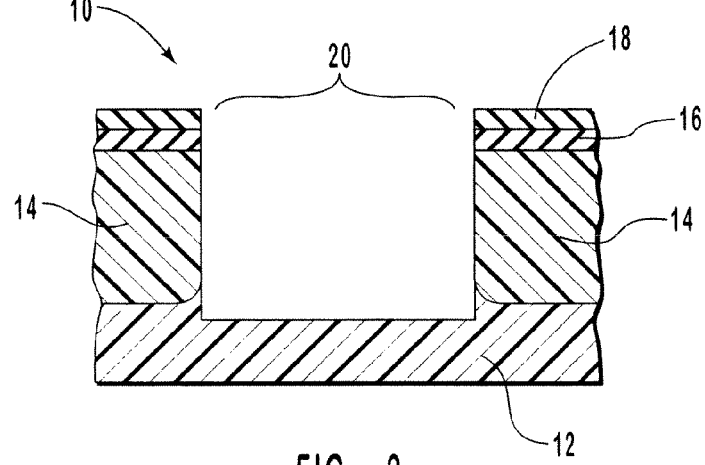
FIG. 2 is a cross-sectional view of a portion of the in-process integrated circuit semiconductor structure of FIG. 1 showing a further step in the method of the present invention, wherein a trench is etched though the sacrificial covering layer.

FIG. 2 shows a further step, preferably conducted after the formation of nitride layer 18, of etching an opening into silicon substrate 12. In the depicted embodiment, a trench 20 is etched through sacrificial oxide layer 16 and nitride layer 18 and into silicon substrate 12. Trench 20 is preferably rectangular and elongated.

Typical processes as are well known in the art are used to etch trench 20. For instance, in one embodiment, trench 20 is patterned with photoresist using conventional photolithography and is then etched with an etching process that etches silicon anisotropically. It is preferred that the etching process used to etch trench 20 be anisotropic in order to prevent undercutting of nitride layer 18 into vertically extending segments 14. Undercutting of vertically extending segments 14 would alter the existing geometry of vertically extending segments 14 and detrimentally affect the performance of the semiconductor devices being formed.

Figure 3:
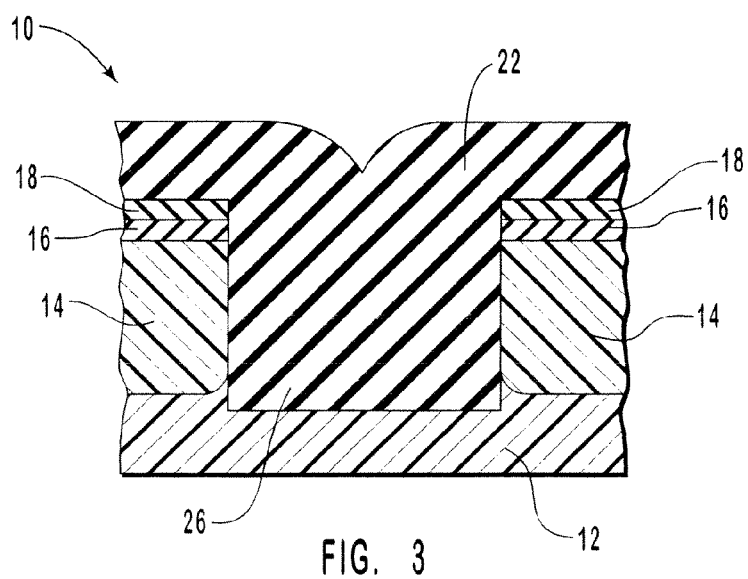
FIG. 3 is a cross-sectional view of a portion of the in-process integrated circuit semiconductor structure of FIG. 2 showing a further step in the method of the present invention, wherein the trench is filled with a conformal dielectric film to form an isolation region.

As shown in FIG. 3, trench 20 is, in a further step, filled by depositing a conformal dielectric film. The conformal dielectric film can comprise, for example, oxide or a silicate glass such as borophosphosilicate glass (BPSG). In the depicted embodiment, the conformal dielectric film comprises an oxide film 22, which has been deposited with a tetraethyl ortho silicate (TEOS) decomposition process. Of course, oxide film 22, such as doped silicon dioxide, could be deposited with any suitable process. Oxide film 22 forms a region of insulating material within trench 20. In the depicted embodiment, the region of insulating material serves as an isolation region 26. Isolation region 26 is a useful structure for such purposes as isolating P-well regions from N-well regions on CMOS integrated circuits as well as for isolating capacitors and preventing latch-up.

Figure 4:
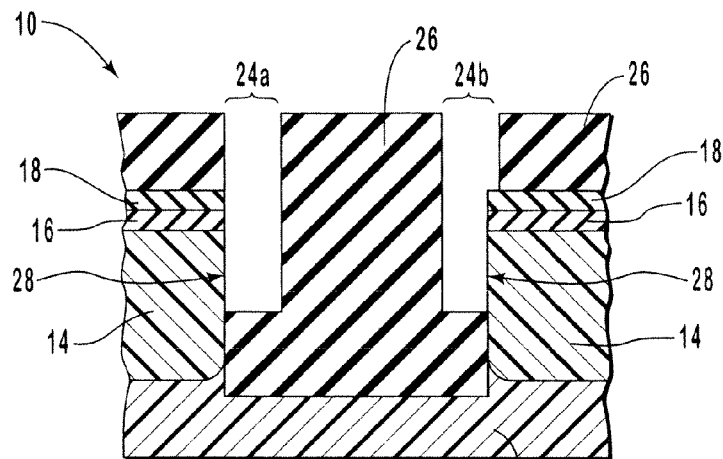
FIG. 4 is a cross-sectional view of a portion of the in-process integrated circuit semiconductor structure of FIG. 3 showing a further step in the method of the present invention, wherein two contact holes are etched into the isolation region, each adjacent a vertical segment of one of the pair of active regions.

FIG. 4 illustrates a further step in the method of the present invention of etching an interconnect structure hole into isolation region 26. In FIG. 4, two interconnect structure holes are formed in isolation region 26 immediately adjacent an adjacent edge 28 of one of vertically extending segments 14. For illustration purposes, both an aligned contact hole 24a and a misaligned contact hole 24b are shown as being formed in FIG. 4. As discussed, it is difficult to exactly align contact holes 24a and 24b with adjacent edge 28 of vertically extending segments 14. Consequently, a misalignment as in misaligned contact hole 24b is a frequent occurrence. Nevertheless, the method of the present invention remedies this shortcoming.

As a remedy to the problem of misalignment of a contact hole, and in accordance with the method of the present invention, a stop-on-feature etching process is used to etch contact holes 24a and 24b that selectively etches oxide at a faster rate than the etching process etches nitride layer 18. Of course, if a sacrificial covering layer other than nitride layer 18 is used, an etching process that is selective to the particular material of the sacrificial covering layer used would then be employed. As a result of the use of the stop-on-feature etching process and the arrangement provided by the present invention wherein vertically extending segments 14 are covered and protected by nitride layer 18, the buried contact etching process self-aligns contact holes 24a and 24b each to an adjacent edge 28 of one of vertically extending segments 14 without causing damage to vertically extending segments 14.

As a consequence of the foregoing, the preexisting geometry of vertically extending segments 14 is maintained and, as a result of the predictability provided thereby, the integrated circuit can be designed with reduced dimensions of vertically extending segments 14. This in turn allows for greater miniaturization of the integrated circuit. Also, the greater accuracy of the stop-on-feature etching process results in a higher yield rate due to better electrical characteristics resulting from the predictability of the geometry.

In the depicted embodiment, a stop-on-feature etching process is selected that selectively etches oxide at a faster rate than the etching process etches nitride. Such etching processes are well known in the art, but as an example, one such etching process comprises a plasma-generated reactive ion etching (RIE) process. The manner of conducting the RIE etching process to selectively etch oxide at a faster rate than it etches nitride is described in U.S. Pat. No. 5,286,344, which is hereby incorporated herein by reference into this document.

Nitride is given as an example of the sacrificial covering layer due to the fact that it is inexpensive, easily manufactured and etched, predictable, and well understood. Of course, sacrificial covering layers other than nitride that are similarly hard and dense could also be used. For instance, a layer of silicon dioxide could also be used. If a sacrificial covering layer other than nitride is selected, a stop-on-feature etching process would then be used that selectively etches the chosen material of the sacrificial covering layer at a substantially higher rate than the material used for the conformal dielectric film is etched.

The stop-on-feature etching process selectively exposes vertically extending segments 14 at each adjacent edge 28 of each of vertically extending segments 14 in order to allow electrical communication with vertically extending segments 14 through contact holes 24a and 24b. Due to the protection provided by nitride layer 18 and the stop-on-feature etching process to vertically extending segments 14, vertically extending segments 14 are neither damaged nor depleted in the course of etching contact holes 24a and 24b.

Figure 5:
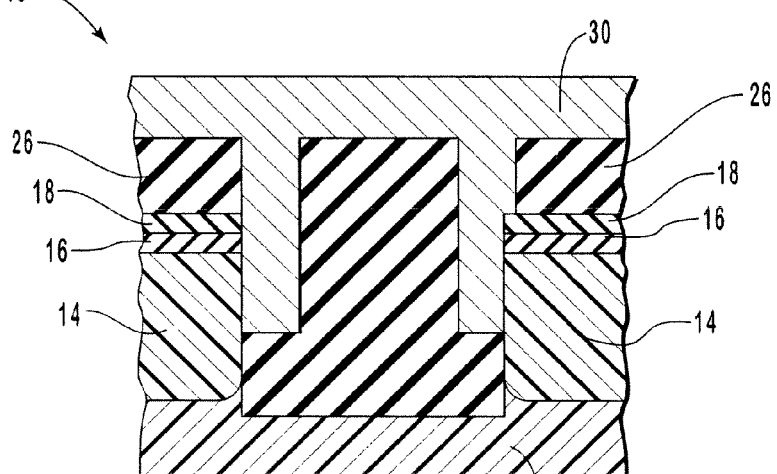
FIG. 5 is a cross-sectional view of a portion of the in-process integrated circuit semiconductor structure of FIG. 4 showing a further step in the method of the present invention, wherein the contact holes are filled by depositing a layer of polysilicon.

FIG. 5 shows a further step of the method of the present invention of at least partially filling contact holes 24a and 24b with an electrically conductive material. The electrically conductive material can comprise, for example, a metal, a semiconductor, or polysilicon. In the depicted embodiment, the electrically conductive material comprises a polysilicon layer 30. Other materials could also be used. For instance, doped polysilicon, nichrome, tantalum, or a cermet could also be used when, for instance, the interconnect structure is intended to function as a resistor. Standard processes are used to deposit polysilicon layer 30. One example of such a process is the pyrolytic decomposition of a precursor material such as disilane. Polysilicon layer 30 can be doped or undoped as best fits the needs of the particular application.

Figure 6:
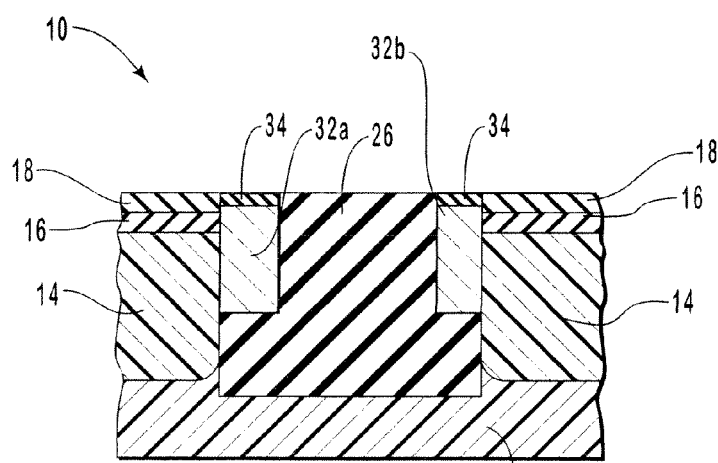
FIG. 6 is a cross-sectional view of a portion of the in-process integrated circuit semiconductor structure of FIG. 5 showing a further step in the method of the present invention, wherein the conformal dielectric film and the polysilicon layer are polished back.

As shown in FIG. 6, after filling contact holes 24a and 24b, the surface of substrate assembly 10 is polished back to the level of nitride layer 18. Polishing back can be conducted by an etchback process or by any form of mechanical polishing, though in the depicted embodiment, polishing back is conducted with CMP. CMP is preferred for polishing back due to the X-Y anisotropy provided therewith. In the depicted embodiment, a CMP process is used which etches oxide and polysilicon, but which stops on nitride. One example of such a CMP process is the use of a polyurethane pad and a KOH or ammonia-based silicate slurry.

The use of CMP to planarize polysilicon layer 30, and at the same time planarize the top of isolation region 26, saves process steps, as planarizing would otherwise have to be conducted in two separate steps. Throughput is thereby increased and integrated circuit fabrication costs are reduced.

The result of the foregoing polishing back step is that contact holes 24a and 24b now form buried contacts 32a and 32b, both of which are aligned to corresponding adjacent edge 28 of vertically extending segments 14. Accordingly, even though misaligned contact hole 24b seen in FIG. 4 was etched with a slight misalignment, it has been aligned by the method of the present invention to corresponding adjacent edge 28 of one of vertically extending segments 14 as shown in buried contact 32b of FIG. 6. The self-alignment of buried contact 32b is enabled by the use of the stop-on-feature etching process together with nitride layer 18, which blocks the stop-on-feature etching process from etching vertically extending segments 14. It is also enabled by the planarization process that removes a portion of misaligned contact hole 24b that was etched over nitride layer 18.

In a further step of the method of the present invention, nitride layer 18 is removed. One manner of removing nitride layer 18 is with a hot phosphoric acid stripping process. In order to keep the polysilicon in buried contacts 32a and 32b clean from contamination by the hot phosphoric acid stripping process, buried contacts 32a and 32b are first capped with oxide. This is done by exposing buried contacts 32a and 32b to oxygen at an elevated temperature to form thin grown oxide layers in the form of oxide caps 34 over each of buried contacts 32a and 32b. The hot phosphoric acid nitride stripping process is then conducted without contaminating the polysilicon in buried contacts 32a and 32b to result in the structure of FIG. 7. The hot phosphoric acid stripping process is convenient in that it can be easily incorporated into existing process flows. Consequently, the method of the present invention can be easily integrated into existing fabrication processes, effectively and with a minimum of expense.

After nitride layer 18 is removed, sacrificial oxide layer 16 and oxide caps 34 are also removed using a suitable process. Vertically extending segments 14 and buried contacts 32a and 32b are at this stage exposed and prepared for the construction of an overlying semiconductor device over the top of each thereof.

Figure 8:
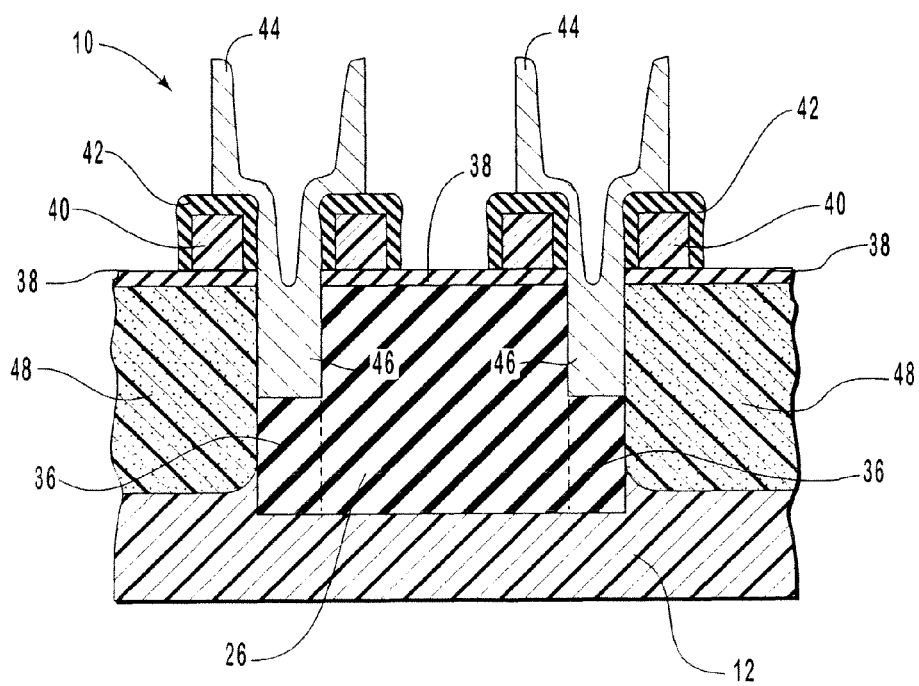
FIG. 8 is a cross-sectional view of a portion of the in-process integrated circuit semiconductor structure of FIG. 7 showing further steps in the method of the present invention, wherein the oxide layer is removed and container capacitor storage nodes adjacent to gate regions are formed over the buried contacts.

While vertically extending segments 14 could be contacts, gate regions, or other conductive structures with a vertical sidewall, in the depicted embodiment, vertically extending segments 14 will be doped to form active regions. Doped active regions 48 are shown in FIG. 8. Vertically extending segments 14 are preferably doped after formation of isolation region 26 to form active regions 48. This will allow active regions 48 to be self-aligned to the edges of isolation region 26.

FIG. 8 illustrates the forming of the overlying semiconductor device, which, in the depicted embodiment, is a set of container capacitor cells. In forming the container capacitor cells, a fresh gate oxide layer 38 is first deposited, and gate regions 40 are then formed above buried contacts 32a and 32b. Gate regions 40 provide control signals to the container capacitor during integrated circuit operation and serve as guides for aligning the container capacitor cell during container capacitor cell formation. Gate regions 40 are subsequently encased in insulating spacers such as oxide spacers 42, after which container capacitor storage nodes 44 are deposited and patterned over buried contacts 32a and 32b, using gate regions 40 for alignment. Buried contacts 32a and 32b serve as landing pads for container capacitor storage nodes 44.

In forming container capacitor storage nodes 44 or other overlying semiconductor devices, it is often necessary to use buried contacts 32a and 32b as sacrificial landing pads. When doing so, buried contacts 32a and 32b may need to be sacrificially etched. The present invention provides a means for preserving the geometry of active regions 48 from damage when sacrificially etching buried contacts 32a and 32b. One example of a means for preserving active regions 48 from damage is the placement of buried contacts 32a and 32b, each to the side of one of active regions 48. Nitride layer 18 can also be left in place to protect active regions 48 from damage when etching buried contacts 32a and 32b as a further means for preserving active regions 48 from damage when sacrificially etching buried contacts 32a and 32b.

The present invention also provides a means for preventing etching of the portion of silicon substrate 12 that underlies buried contacts 32a and 32b. One example of a means for preventing damage to the portion of silicon substrate 12 that underlies buried contacts 32a and 32b while etching buried contacts 32a and 32b is shown in the depicted embodiment. As shown therein, isolation region 26 is formed with a greater depth than buried contacts 32a and 32b. Consequently, an underlying portion 36 of isolation region 26 underlies buried contacts 32a and 32b. By forming buried contacts 32a and 32b above underlying portion 36, buried contacts 32a and 32b can be sacrificially etched, even to the point of being penetrated completely through, without damaging underlying active regions 48.

Underlying portion 36 of isolation region 26 allows extreme over-etch and, as a result, buried contacts 32a and 32b can be etched to as great a degree as necessary. An over-etch that etches into underlying portion 36 of isolation region 26 is prevented by underlying portion 36 from damaging either of silicon substrate 12 or active regions 48. This adds toleration to the process flow and is particularly useful when it becomes necessary to etch deeply into a landing pad. It is also particularly useful when using an etching process that etches portions of substrate assembly 10 at a faster rate (e.g., at the center thereof) than other portions (e.g., at the edge thereof).

In completed container capacitor storage nodes 44, buried contacts 32a and 32b have a container capacitor cell base 46. Underlying portion 36 of isolation region 26 underlying each of buried contacts 32a and 32b has the additional function of insulating buried contacts 32a and 32b from silicon substrate 12 and thereby reducing charge leakage from container capacitor cell base 46 into silicon substrate 12.

Figure 7:
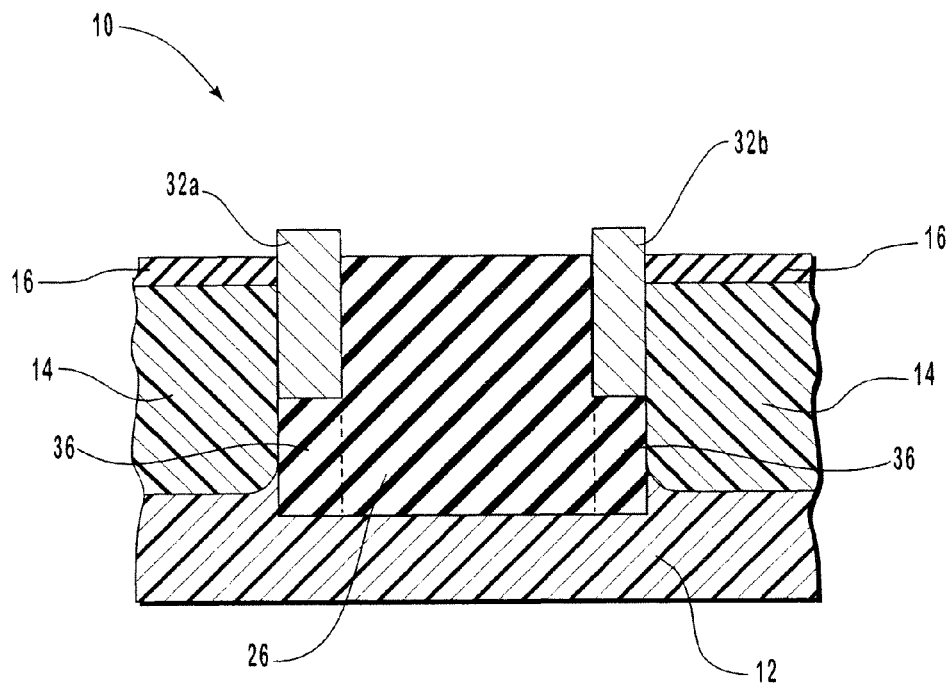
FIG. 7 is a cross-sectional view of a portion of the in-process integrated circuit semiconductor structure of FIG. 6 showing further steps in the method of the present invention, wherein the sacrificial oxide caps and the nitride layer are removed.

The present invention provides a unique interconnect structure which is self-aligned and which can be sacrificially etched due to the step of taking a horizontal interconnect structure from the prior art and causing it to have a planar vertical interface. Shown in FIG. 7 are two such interconnect structures that comprise buried contacts 32a and 32b. Each of buried contacts 32a and 32b comprises a vertically extending plug of electrically conductive material formed in isolation region 26 at an edge 28 of one of active regions 48. Each of buried contacts 32a and 32b contacts at one side thereof a vertical segment of one of active regions 48 with a planar vertical interface. A top surface of each of buried contacts 32a and 32b electrically contacts one of overlying container capacitor storage nodes 44. Container capacitor storage nodes 44 are in electrical communication with one of active regions 48 only through one of buried contacts 32a and 32b.

The sacrificial self-aligned interconnect structure of the present invention could also comprise a plug, capacitor bale, landing pad, resistor, diode, or such that is formed in a self-aligned interconnect structure opening in an isolation region.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A self-aligned interconnect structure, comprising:
   a substrate comprising at least one vertically extending segment doped to form at least one active area;
   a trench in the substrate filled with a dielectric material, wherein the at least one active area is self-aligned along a planar vertical interface with the dielectric material and extends substantially the same depth as the trench; and
   a vertically extending conductive material immediately adjacent to an edge of the at least one vertically extending segment of the substrate, the vertically extending conductive material abutting an edge of the at least one vertically extending segment of the substrate and abutting the dielectric material at two edges.

2. The self-aligned interconnect structure of claim 1, wherein the vertically extending conductive material overlies at least a portion of the dielectric material.

3. The self-aligned interconnect structure of claim 1, wherein at least a portion of the vertically extending conductive material extends beyond an upper surface of the vertically extending segment of the substrate and the dielectric material.

4. The self-aligned interconnect structure of claim 1, wherein the vertically extending conductive material contacts the vertically extending segment of the substrate at a planar vertical interface.

5. The self-aligned interconnect structure of claim 1, wherein a portion of the dielectric material underlies the vertically extending conductive material and contacts the at least one vertically extending segment of the substrate.

6. The self-aligned interconnect structure of claim 1, wherein the vertically extending conductive material comprises polysilicon.

7. The self-aligned interconnect structure of claim 1, further comprising an overlying container capacitor storage node in electrical contact with the vertically extending conductive material.

8. The self-aligned interconnect structure of claim 1, wherein the vertically extending conductive material electrically connects the at least one active area and a semiconductor device.

9. The self-aligned interconnect structure of claim 8, wherein the semiconductor device comprises a container capacitor cell, and wherein the vertically extending conductive material forms a base of the container capacitor cell.

10. A self-aligned interconnect structure, comprising:
   a substrate comprising at least one vertically extending segment doped to form at least one active area;
   a trench in the substrate filled with an insulating material, wherein the at least one active area is self-aligned along a planar vertical interface with the insulating material and extends substantially the same depth as the trench; and
   at least one contact hole in the insulating material filled with a conductive material, wherein the conductive material extends at least partially along the planar vertical interface of the at least one active area and the insulating material.

11. The self-aligned interconnect structure of claim 10, wherein the at least one contact hole is self-aligned to an adjacent edge of the at least one vertically extending segment.

12. A self-aligned interconnect structure, comprising:
   a substrate comprising at least one vertically extending segment;
   a trench in the substrate filled with a dielectric material, wherein the at least one vertically extending segment is self-aligned along a vertical interface with the dielectric material and extends substantially the same depth as the trench; and
   at least one contact hole in the dielectric material immediately adjacent to an edge of the at least one vertically extending segment, wherein at least a portion of the at least one contact hole is filled with an electrically conductive material, the electrically conductive material abutting an edge of the at least one vertically extending segment of the substrate and abutting the dielectric material at two edges.

13. The self-aligned interconnect structure of claim 12, wherein the at least one vertically extending segment comprises a contact or a gate region.

* * * * *